United States Patent [19]

Yoder et al.

[11] Patent Number: 4,914,743

[45] Date of Patent: Apr. 3, 1990

[54] YOKED ORTHOGONALLY DISTRIBUTED EQUAL REACTANCE NON-COPLANAR TRAVELING WAVE AMPLIFIER

[75] Inventors: Max N. Yoder, Falls Church, Va.; Michael A. Morgan, Pacific Groves, Calif.

[73] Assignee: The United States of America as represented by the Secretary of the Navy, Washington, D.C.

[21] Appl. No.: 95,487

[22] Filed: Aug. 27, 1987

[51] Int. Cl.$^4$ ............................................. H01L 27/02
[52] U.S. Cl. ..................................... 357/41; 357/16; 357/55; 357/22
[58] Field of Search ................... 357/41, 55, 16, 22 G, 357/22 K, 23.1

[56] References Cited

U.S. PATENT DOCUMENTS 4,537,654  8/1985  Berenz et al. .................... 357/22 K
4,755,867  7/1988  Cheng ............................. 357/55

OTHER PUBLICATIONS

M. N. Yoder "Applications of Diamond Technology" (copies of viewgraphs shown Jul. 1986).
"Solicitation No. N00014-86-R-0047" (Source Selection Procedure: Traveling Wave Techniques for Broadband Power Amplifiers) (mailed on or about Sep. 1, 1986).

Primary Examiner—Andrew J. James
Assistant Examiner—Mark Prenty
Attorney, Agent, or Firm—Thomas E. McDonnell; Edward F. Miles

[57] ABSTRACT

A Field Effect Transistor (FET) device especially useful in common gate amplifiers of signals in the microwave to millimeter range. The device's input and output are impedence matched to preclude phase cancellation and form a traveling wave amplifier capable of high voltage operation. The channel is formed of gallium arsenide separated from the gate by a layer of aluminum arsenide heteroepitaxial with gallium arsenide layer. The channel is bounded by heavily doped regions which act as inherent sources and drains, and limit electric field strength to avoid sluggish response of heavy mass carriers. The gates are formed by etching trenches in a semi-insulating gallium arsenide layer on the opposite side of the aluminum arsenide layer from the channel, using the aluminum arsenide as an etch stop, oxidizing the exposed aluminum arsenide, and epitaxially growing gallium arsenide to narrow the trench. The resulting gate is disposed on opposite sides of the channel from the source and drain contacts thus significantly improving gate-drain breakdown voltage. The resulting device has an increased power capacity and increased response time, but is simpler to fabricate. In alternate embodiments, several such devices are yoked together in a single monolith, with adjacent sources and drains of adjacent stages being unitary, further simplifying device fabrication, and increasing its dynamic range.

7 Claims, 3 Drawing Sheets

YOKED ORTHOGONALLY DISTRIBUTED EQUAL REACTANCE NON-COPLANAR TRAVELING WAVE AMPLIFIER

BACKGROUND OF THE INVENTION

Reference is made to co-pending application, "Yoked, Orthogonally Distributed Equal Reactance Amplifier," of Max Yoder filed Aug. 27, 1987, Ser. No. 087,892, and copending application "High Power Diamond Traveling Wave Amplifier" of Max Yoder, filed 9/25/87, Ser. No. 101,919.

The invention pertains to unipolar semiconductor amplifiers, and in particular presents integral single and multistage Field Effect Transister (FET) devices especially useful with microwave and millimeter wave signals.

Field Effect Transistors are commonly used as amplifiers of high frequencies, such as millimeter waves and microwaves, most often in common source amplifier circuits. Common source amplifiers, however, have the inherent theoretical drawback that their inputs and outputs cannot be impedance matched, making input and output phase cancellation inescapable, a consequence of which being that FET amplifiers have had to be made a small fraction of a wavelength in the direction of wave propagation through the FET so as to minimize phase cancellation. This, unfortunately, drastically limits the FET's power handling capability. Notably, however, common gate amplifiers can, as a matter of theory, have impedance matched inputs and outputs. Thus any FET that is internally designed to have a precisely matched input and output would, where employed in an appropriate common gate amplifier circuit, be of especial value as a high frequency amplifier.

Another limitation of FET power capacity results from a peculiar property of the crystalline structure of many semiconductors (such as gallium-arsenide) that occurs at the terminating edge of an epitaxially grown crystal. At the crystal's edge, or interface with another non-lattice-matched material, uncompleted covalent bonds tend to cross-bond weakly with one another, providing an unwanted source of charge carriers. These weakly bound surface or interface carriers (or trapped charges), rather than the carriers distributed throughout the rest of the device, determine the device's ultimate breakdown potential. Another limit on the gain and power capacity of an FET device is the breakdown voltage of the material separating the device's gate from the channel, i.e., the potential beyond which signal degrading leakage current occurs between the gate and the channel.

The upper frequency limit of any device is set by the device's response time, i.e., the speed by which carriers can traverse the device. In FET devices, potential on the gate controls a depletion region in the channel, around which current controlled by the FET must travel. The length of the depletion region in the direction of current flow depends on the transverse length of the gate itself. By reducing the transverse dimensions of the gate, one would reduce the depletion region's length thus enabling current to traverse a shorter path and the device to respond more rapidly. Another limit on device speed is the property of some semiconductors whereby carrier drift velocity, as a function of electric field intensity, increases to a maximum, then falls sharply. (An example is Gallium Arsenide, as illustrated in FIG. 4.) In FET devices, this property causes charge carrier transit to slow, rather than rise, with increasing channel potential beyond this maximum. (Carriers in such a high field region are called "sluggish" or "heavy.") Also, this property causes carrier bunching, and the formation of dipole domains or regions within the channel, generating local fields that impede the flow of carriers through the channel. This further limits device response speed, as well as making control of the device more difficult.

Finally, the fabrication of semiconductor devices is an especially delicate industrial process, and the more steps required to fabricate any device, and the less tolerant such steps are of error, the more the probability that the device will be produced with some fatal defect. Among the techniques least tolerant of error is the etching of desired configurations in semiconductor blocks. Of especial usefulness are semiconductors that have sharply different etchabilities so that, when used to form adjacent strata of the same chip, the etch resistant semiconductor can act as a simple and reliable etch stop for the less resistant semiconductor.

Accordingly, it is plain that any FET device that can overcome any or all of these limitations in the technology would be most welcome.

SUMMARY OF THE INVENTION

Accordingly, an object of the invention is to provide an FET device especially useful in common gate circuits for amplifying millimeter and microwave signals.

Another object of the invention is to impedance match the device's input and output, so as to preclude phase cancellation between input and output.

Another object of this invention is to increase the power handling capacity of the device by eliminating low-voltage surface breakdown in the device's channels.

Another object of the invention is to increase the device's dynamic range by increasing the potential between gate and channel at which unwanted gate current occurs.

Another object of the invention is to simplify the device's fabrication by forming at least some adjacent layers of materials having sharply different etchabilities.

Another object of the invention is to improve the speed and operation of the device by quenching dipole domains formed in the device's channels.

Another object of the invention is to increase the device's response speed, and hence frequency range, by restricting electric field magnitudes between gain stages to at or below that for which the carrier velocity versus electric field strength curve, for the semiconductor material of which the channel is made, becomes differentially negative.

Another object of the invention is to increase the device's response time by narrowing, in the direction of carrier flow, the length of the interface between the gate metal, and the material isolating the gate from the gate metal.

Another object of the invention is to increase the device's response time, and simplify its fabrication, by eliminating the source-drain metallization common to contiguous stages, thus simplifying the device and shortening it in the direction of charge carrier flow.

Another object of the invention is to increase such device's dynamic range, and further simplify fabrication, by yoking together a plurality of such devices formed in a single monolith.

In accordance with these and other objects made apparent hereinafter, there is disclosed a novel integral FET device especially useful as an amplifier of millimeter and microwave signals. The FET has an undoped aluminum arsenide layer disposed between a semi-insulating substrate of gallium arsenide, and a hetero-epitaxial overlying layer of gallium arsenide, the latter forming the device' channel. The device's input portion (source and gate) and its output portion (drain and gate) are configured into mirror images of one another as viewed in the direction of wave propagation along these portions. Because of the relatively large band gap in, and Schottky potential on, aluminum arsenide compared with other semiconductors such as gallium arsenide, the FET can handle correspondingly larger input signals before unwanted gate current occurs. It also permits a slight accumulation of the charge density in the GaAs channel during large input signal drive. Because the aluminum arsenide layer is lattice-matched to both the underlying and overlying GaAs, there are no trapped charges in the channel interface resulting from cross bonding at the channel's surface to allow low voltage breakdown. Because the device is formed monolithically, and because of the mirror image geometry, the stages are impedance (and thus phase velocity) matched, and the device can be built long in the direction of wave propagation without phase cancellation between input and output. Moreover, because aluminum arsenide oxidizes very quickly in an oxygen atmosphere, one can selectively prevent further epitaxial growth on the existing aluminum arsenide layer merely by exposing the aluminum arsenide to air. Aluminum arsenide is much more resistant to conventional etching processes than are many semiconductors (for example, gallium arsenide), and any aluminum arsenide portion of a semiconductor can act as a very practical etch stop material for adjacent strata of gallium arsenide during semiconductor fabrication. These characteristics of aluminum arsenide can be exploited to fabricate a FET gate in which the interface between the gate metal and the aluminum arsenide separating the channel and metal, is of a length in the direction of current flow smaller than is obtainable with conventional etching techniques such as photo-lithography alone. This is done by first etching trenches in the underlying semi-insulating gallium arsenide layer, oxidizing the exposed aluminum arsenide layer to prevent epitaxial growth thereon, then epitaxially re-growing gallium arsenide on the trench side walls. Polycrystalline GaAs grown on the oxidized AlAs is subsequently easily differentially etched away. The device's channels are of moderately doped carrier material, with discrete regions in the channel very heavily doped and serving as channel end stops for the different amplifier stages. The highly doped end stops provide a region of lowered electric field such that the carriers, as they traverse these end stops, can enter the following portion of the device at or near their maximum possible velocity. The heavily doped end stops, again because of their relatively high doping with respect to the remainder of the channel, causes dipole domains to be collected and quenched.

In one embodiment, a plurality of these devices are formed unitarily in a single monolith, and yoked together source to drain. Because the plural stage amplifier is integral, the drain of one stage can also serve as the source of the next, thus eliminating a semiconductor part and the several steps necessary to fabricate the part. Because the highly doped channel regions have significantly less resistivity than the remainder of the channels, these regions alone are capable of acting as channel end stops, eliminating the need for metal microstrips as the source-drains of interior stages, thus further simplifying the device and precluding unwanted backward traveling waves.

The invention will be more fully understood from the following detailed description of preferred embodiments, it being understood, however, that the invention is capable of extended application beyond the precise details of the preferred embodiments. Changes and modification can be made that do not affect the spirit of the invention, nor exceed its scope, as expressed in the appended claims. Accordingly, the invention will now be described with particular reference to the accompanying drawings, wherein:

DETAILED DESCRIPTION OF THE INVENTION

Figure 1:
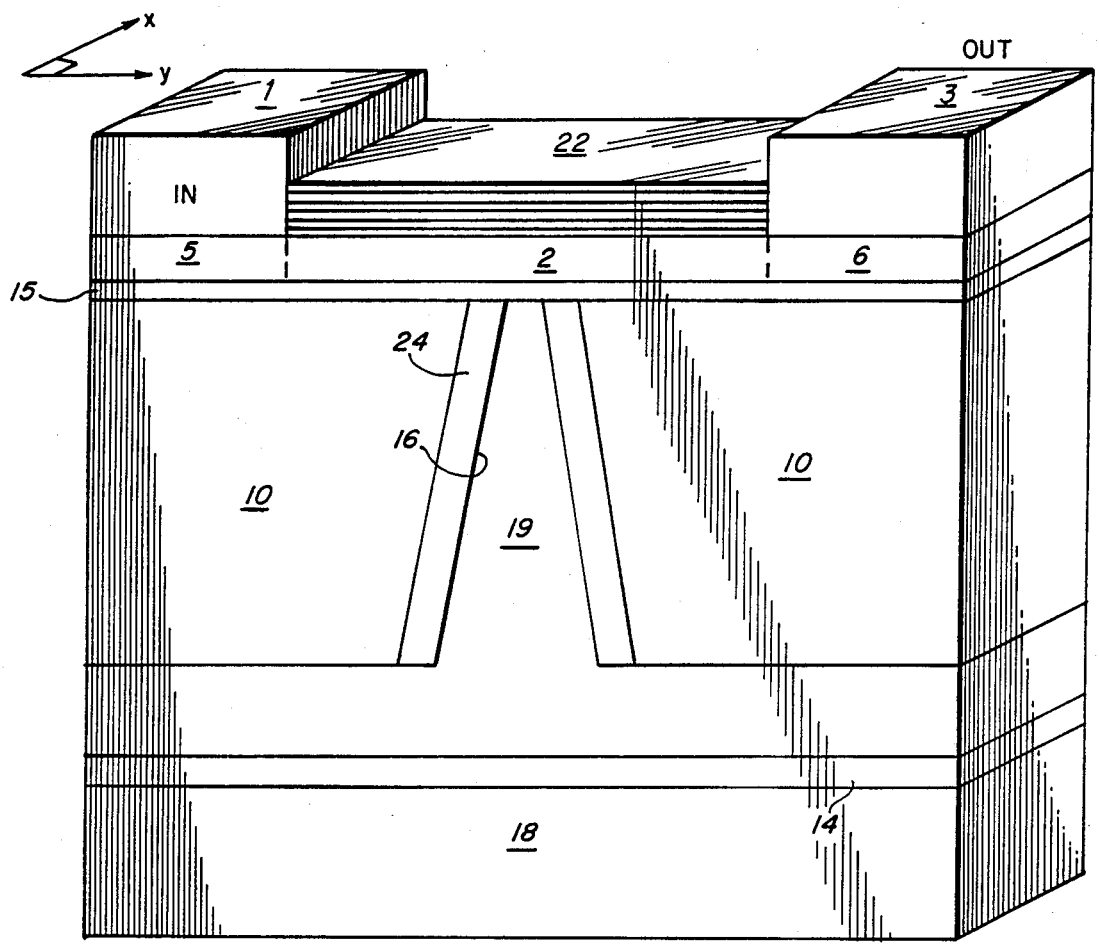
FIG. 1 is a isometric side view, not to scale, of an embodiment of the invention.

With particular reference to FIG. 1, an FET amplifier according to the invention is shown. The device has a unitary n-doped gallium arsenide layer with regions 2, 5, 6. Regions 5 and 6 are more heavily doped than region 2. Along with microstrip 1, region 5 constitutes the device's source; and along with microstrip 3, region 6 constitutes the device's drain. Region 2 of the unitary layer is the device's channel. Between microstrip 1 and 3 is un-doped superlattice 22 which has alternating sublayers of aluminum arsenide and gallium arsenide. Superlattice 22 acts as a heterojunction with channel 2 to reduce surface self-depletion in channel 2, thus increasing maximum channel current, and improving device output conductance. The unitary layer 2, 5, 6 of the device is preferably fabricated from semiconductor material such as gallium arsenide. Underlaying the device's channels is a layer 15 of aluminum arsenide heteroepitaxial with the layer of gallium arsenide 2, 5, 6. Underlaying layer 15 of aluminum arsenide is a semi-insulating substrate 10 of gallium arsenide having trench 16 to accommodate metallic gate 19. Beneath gate 19 is dielectric 14, and metal mounting substrate 18.

The large difference in etchability between aluminum arsenide and gallium arsenide can be exploited to easily form gate trench 16. Photo-assisted etching is preferred to accomplish the high depth to lateral dimensional ratio. After heteroepitaxially growing aluminum arsenide layer 15 on semi-insulating gallium arsenide layer 10, the layer of gallium arsenide having regions 2, 5, 6 is heteroepitaxially grown atop aluminum arsenide 15. Layer 10 of gallium arsenide is then etched locally from the underside in the vicinity of 19 until the etchant reaches aluminum arsenide layer 15. Because the etchabilities of aluminum arsenide and gallium arsenide differ so greatly, the penetration of gallium arsenide layer 10 to the aluminum arsenide layer 15 in effect stops the etching process. Thus, one need not resort to exceptionally delicate techniques to control the depth of trench 16. After forming trench 16, the locally exposed surface of layer 15 is allowed to oxidize in air and a thin layer of gallium arsenide 24, is grown epitaxially on semi-insulating substrate 10 within trench 16. The epitaxially grown gallium arsenide (backfill) 24 does not grow on the oxidized aluminum arsenide surface, but does serve, by narrowing trench width, to shorten the effective distance (in the direction of electron propagation) of subsequently deposited metal control gate 19. Thus, the effective length of the control gate can be much less than would otherwise be possible from photolightography. Any polycrystalline GaAs deposited on the oxidized AlAs is easily differentially etched away. This narrowed gate length improves device performance (e.g., raises frequency range) without reducing device yield. Thereafter the trench is filled with metal 19 to form the finished gate. Besides easing device fabrication, placement of gate 19 on the opposite side of layer 15 from channel 2 provides for more efficient RF grounding of gate 19. Were gate 19 on the opposite side of channel 2, coplanar with microstrips 1 and 3, the breakdown voltage of the device would be lowered as would its maximum power output. A dielectric 14 is then placed thereunder, and final metal substrate 18 placed under dielectric 14. As can be seen from FIG. 1, the geometry of the device is chosen so that the device's input portion (source 1, 5 and gate 11), and the device's output portion (drain 3, 6 and gate 19), are mirror images of one another.

In operation, a traveling electromagnetic wave enters the device at the end of source strip 1 marked "IN". Source 1, 5 and gate 19 on the one hand, and drain 3, 6 and gate 19 on the other, act as equi-velocity transmission lines as the wave propagates through the device in the direction marked "x". The current in the device moves in the direction marked "y", i.e., through channel 2 between source 1, 5 and drain 3, 6 and serves to couple the signal from the device's input portion (source 1, 5 and gate 19) and output portion (drain 3, 6 and gate 19). As such, the electromagnetic signal appears to move through the device in a vector direction between x and y. Because the input and output portions of the amplifier device are integrally fabricated of identical material, and have identical mirror image geometries, the stages are impedance and velocity matched, and the wave reinforces itself between the input and output portions, rather than cancels. Accordingly, this device can be made long in the "x" direction, the ultimate practical limitation on this dimension resulting from attenuation, rather than phase interference, with an increase in the device's power capacity corresponding to the device's increase in size.

Figure 2:
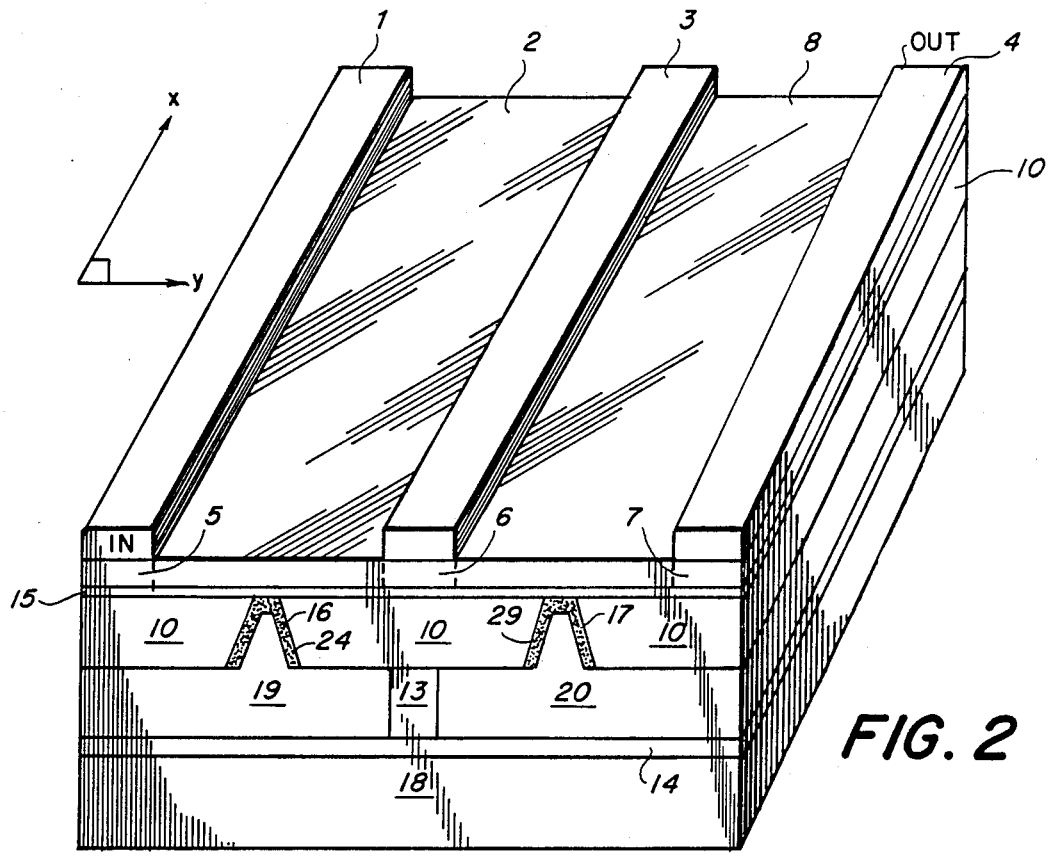
FIG. 2 is a view similar to FIG. 1 showing another embodiment of the invention.

With particular reference to FIG. 2, a device is shown combining two such devices as shown in FIG. 1 into one integral two stage amplifier device. (Like numerals between FIGS. 1 and 2 denote like structures.) The unitary doped layer of gallium arsenide contains additional regions 8, which serves as the second stage's channel, and heavily doped region 7, which, along with microstrip 4, serves as the second stage's drain. Second stage gate 20 is disposed in gate trench 17 with epitaxial gallium arsenide growth 22 serving the same function as growth 24 of the first stage. Resistive portion 13 separating gates 19 and 20 sets the appropriate d.c. bias for the second state. Besides serving as the drain of the device's first stage, microstrip 3 and region 6 also constitute the source of the device's second stage, the second stage's channel comprising heavily doped regions 6 and 7 and less heavily doped region 8. Because strip 3 and region 6 serve both amplifier stages, one has eliminated a part of the chip, as well as the manufacturing steps necessary to incorporate the part into the chip; thus the chip can be shortened, increasing device response time proportionately. Also, forming the plural stage device monolithically ensures great uniformity of material between corresponding mirror image points in each stage. This, along with device geometry, ensures that the phase velocities of signals propagating through different portions of the device will be virtually equal, virtually eliminating phase cancellation between stages, and between the input and output portions of each stage.

Although the device of FIG. 2 shows a device of two stages it is plain that a device of more than two such stages is equally within the scope of the invention.

Figure 3:
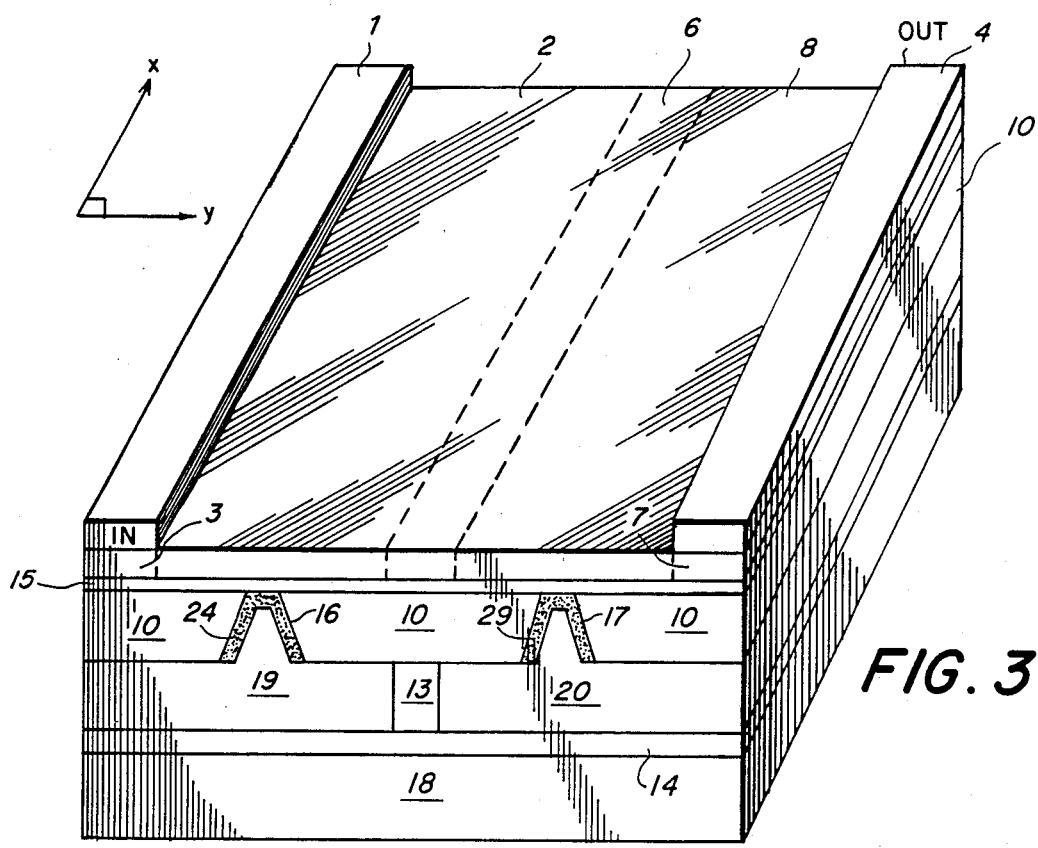
FIG. 3 is a view similar to FIG. 2 showing an advantageous variation of the device of FIG. 2.

With particular reference to FIG. 3, a device very similar to that in FIG. 2, is illustrated with the important difference that the overlying metal strip (shown in FIG. 2 by reference numeral 3) is eliminated. In both the embodiments of FIGS. 2 and 3, region 6 of the device serves as the drain for the device's first stage, and source for the device's second stage. Because of the heavy impurity differential doping in region 6, it functions as a drain for region 2 and source for region 8. Thus, no external connection to this intermediate source-ground is necessary, and metalized strip 3 of FIG. 2 preferentially can be dispensed with, further simplifying the device, rendering it incrementally more reliable to fabricate, and eliminating reflections of electromagnetic signals at the ends, and unwanted backward traveling waves.

Figure 4:
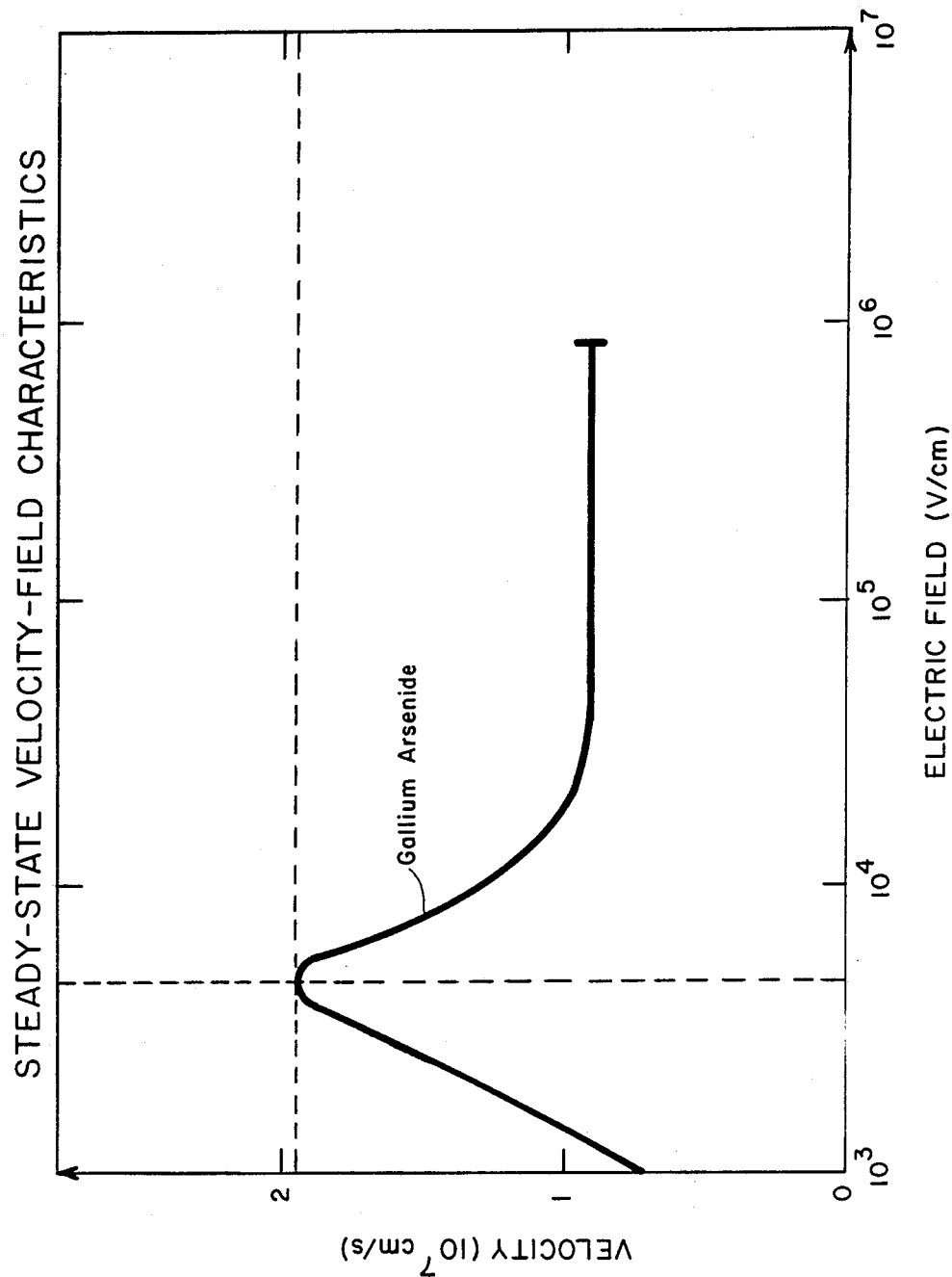
FIG. 4 is a graph showing the relationship between the drift velocity of carriers in n-doped gallium arsenide, as a function of field potential.

With particular reference to FIG. 4, one can see the relationship between electric field and drift velocity for semiconductors such as gallium arsenide. Drift velocity increases with increasing electric field in gallium arsenide until the field roughly equals 3.5 kV/cm. Thereafter with increasing electric field, charge carrier drift velocity drops drastically. Because end stop regions 5, 6, 7 of the unitary n-doped gallium arsenide layer of the embodiments of FIGS. 1, 2, and 3 are so heavily doped with respect to channel portions 2 and 8 of the unitary gallium arsenide layer the electric field in these heavily doped regions is sufficiently low to ensure that carriers traversing these respective regions 5, 6, and 7 of the device do so with velocities beneath the velocity peaks illustrated in FIG. 3, greatly improving the device's response time. Moreover, dipole domains forming within channel portions 2 and 8 tend to drift towards regions 6, 7, where these domains are collected and dissipated; thus forming region 2 do not interfere with the performance of the device. Region 6 forms not only a virtual drain for region 2 and a virtual source for region 8, but because of the low electric field within region 6 insures that electrons entering region 8 are in their low effective moss state characteristic of electron subjected to electric fields of less than 3.5 kV/cm as shown in FIG. 4.

The invention has been shown and described in what is considered to be the most practical and preferred embodiments. It is recognized, however, that obvious modifications may occur to those skilled in this art. Accordingly, the scope of the invention is to be discerned solely by reference to the appended claims.

What is claimed and desired to be secured by letters patent of the United States is:

1. An FET device comprising:
   one or more FET stages formed in a single monolith, each stage of said one or more stages comprising a source, a drain, a gate and a channel;
   said source and said gate of each said stage constituting the input portion of said each stage;
   said drain and said gate of said each stage constituting the output portion of said each stage;
   said input portion and said output portion of each said stage having mirror image geometry with respect to one another;
   said monolith comprising a first layer of semiconductor and a second layer heteroepitaxial with said first layer;
   said first layer comprising said channel of said each stage;
   said second layer being disposed in said monolith between said first layer and said gate of said each stage;
   said mirror image geometry, and said stages being formed in said single monolith, being effective to substantially impedence match said input and said output portions, whereby said impedence match is effective to preclude phase cancellation between said input and said output portions.

2. The device of claim 1, wherein said first layer is gallium arsenide and said second layer is aluminum arsenide.

3. The device of claim 1, wherein:
   said channel of said each stage comprises a pair of regions heavily doped with respect to the remainder of said channel, one of said pair of regions of said channel being effective as the source of said each stage, the other of said pair of regions being effective as the drain, said pair of regions being doped effective to prevent the generation of electric fields in either of said pair of regions larger than the field corresponding to the maximum steady state drift velocity of carriers in the semiconductor material of which said first layer is made.

4. The device of claim 3, wherein said one or more stages is a plurality of stages yoked together sequentially, source to drain, and wherein adjacent sources and drains of sequentially adjacent of said plurality of stages are unitary.

5. The device of claim 4, wherein said first layer is n-doped gallium arsenide, and said second layer is aluminum arsenide.

6. A semiconductor device comprising at least two semiconductor layers, one layer of said layers having a higher etchability than the other layer, said device produced by a process comprising steps for:
   etching a trench in said one layer, said etching being halted by said other layer having lower etchability than said one layer, said etching being effective to expose a portion of said other layer to said trench;
   exposing said portion of said other layer to an oxygen atmosphere effective to oxidize the surface of said portion sufficiently to prevent heteroepitaxial growth on said portion of said other layer;
   forming an epitaxial growth on the surface of said trench, said step for forming being effective to cause said epitaxial growth to nonheteroepitaxially cover a subportion of said portion of said other layer effective to narrow said portion of said other layer exposed to said trench.

7. The device of claim 6, wherein said device is an FET having a channel, said other layer is disposed between said channel and said one layer, and said process further comprises the step of filling said trench with material effective to make said material in said trench the gate of said FET.

* * * * *